(12) United States Patent
Zoehner

(10) Patent No.: US 11,202,146 B1
(45) Date of Patent: Dec. 14, 2021

(54) IP SPEAKER SYSTEM

(71) Applicant: ALGO COMMUNICATION PRODUCTS LTD., Burnaby (CA)

(72) Inventor: Paul Zoehner, Coquitlam (CA)

(73) Assignee: ALGO COMMUNICATION PRODUCTS LTD., Burnaby (CA)

( * ) Notice: Subject to any disclaimer, the term of this patent is extended or adjusted under 35 U.S.C. 154(b) by 0 days.

(21) Appl. No.: 17/011,074

(22) Filed: Sep. 3, 2020

(51) Int. Cl.
| | |
|---|---|
| *H03G 11/00* | (2006.01) |
| *H04R 3/00* | (2006.01) |
| *H03M 1/66* | (2006.01) |
| *H04L 29/06* | (2006.01) |

(52) U.S. Cl.
CPC .............. *H04R 3/007* (2013.01); *H03M 1/66* (2013.01); *H04L 65/601* (2013.01); *H04R 2420/07* (2013.01)

(58) Field of Classification Search
CPC ...................................................... H03G 11/00
See application file for complete search history.

(56) References Cited

U.S. PATENT DOCUMENTS

| | | | | | |
|---|---|---|---|---|---|
| 3,989,908 | A  * | 11/1976 | Budrys | .................. | H04R 27/00 381/59 |
| 8,265,294 | B2 * | 9/2012 | Tjalsma | ............... | H04R 29/007 381/82 |
| 8,903,099 | B2 * | 12/2014 | Martin | .................... | H04M 9/08 381/58 |
| 9,565,504 | B2 * | 2/2017 | Miyata | .................. | H04R 29/002 |
| 9,661,432 | B2 * | 5/2017 | Silzle | ..................... | H04R 5/027 |
| 9,774,966 | B1 * | 9/2017 | Bundy | .................... | G06F 3/162 |
| 10,631,090 | B1 * | 4/2020 | Elliot | ....................... | H04R 3/12 |

(Continued)

OTHER PUBLICATIONS

Website Information, ALGO, 8188 SIP Ceiling Speaker, downloaded from the internet on Sep. 17, 2020 at https://www.algosolutions.com/product/8188-sip-ceiling-speaker/ (77 pgs) [Applicant submits that this information was available for download before the filing date of the present application.].

(Continued)

*Primary Examiner* — Olisa Anwah
(74) *Attorney, Agent, or Firm* — Stinson LLP

(57) ABSTRACT

An IP speaker system is disclosed that includes an IP speaker connected to one or more external analog speakers. The IP speaker comprises a CPU that provides an audio data stream for transmission to a first amplifier and a second amplifier. The first amplifier outputs a first analog audio signal at a first power level for driving an internal driver of the IP speaker, and the second amplifier outputs a second analog audio signal at a second power level for driving one or more external drivers of the one or more external analog speakers. The CPU supervises the one or more external analog speakers so as to detect any speaker failure, disconnection, short or other change in operational status. The IP speaker also comprises a power circuit that receives electrical power transmitted over a network cable as its input power and provides output power available for consumption by the IP speaker and the one or more external analog speakers. The power circuit measures the input power and decreases the output power if the measured input power exceeds a predetermined power level.

29 Claims, 10 Drawing Sheets

(56) References Cited

U.S. PATENT DOCUMENTS

| | | | | |
|---|---|---|---|---|
| 2002/0071569 | A1* | 6/2002 | Wood | H04R 29/001 381/59 |
| 2003/0063755 | A1* | 4/2003 | Nourse | H04R 29/007 381/82 |
| 2006/0182288 | A1* | 8/2006 | Arcaria | H04R 29/007 381/82 |
| 2009/0304195 | A1* | 12/2009 | Fillol | H04R 29/007 381/59 |
| 2011/0311072 | A1* | 12/2011 | Waller, Jr. | H04R 27/00 381/80 |
| 2020/0084559 | A1* | 3/2020 | Huber | G08B 29/043 |
| 2020/0396554 | A1* | 12/2020 | Castonguay | H03F 3/68 |

OTHER PUBLICATIONS

Website Information, ALGO, 8301 SIP Paging Adapter & Scheduler, downloaded from the internet on Sep. 18, 2020 at https://www.algosolutions.com/product/8301-ip-paging-adapter-bell-scheduler/ (128 pgs) [Applicant submits that this information was available for download before the filing date of the present application.].

Website Information, ALGO, 8186, SIP Horn Speaker, downloaded from the internet on Sep. 18, 2020 at https://www.algosolutions.com/product/8186-sip-horn-speaker/ (76 pgs) [Applicant submits that this information was available for download before the filing date of the present application.].

Website Information, ALGO, 8180 SIP Audio Alerter, downloaded from the internet on Sep. 18, 2020 at https://www.algosolutions.com/product/8180-sip-audio-alerter/ ( 77 pgs) [Applicant submits that this information was available for download before the filing date of the present application.].

Website Information, Wahsega Labs, 2×2 Ceiling Speaker with InformaCase and SIP, downloaded from the internet on Sep. 18, 2020 at https://www.wahsega.com/products/informacast-endpoints/2x2-ceiling-speaker-with-informacast-and-sip/ (51 pgs) [Applicant believes that this information was available for download before the filing date of the present application.].

Website Information, CyberData Corporation, 011394/011393 SIP Speaker, downloaded from the internet on Sep. 18, 2020 at https://www.cyberdata.net/products/011393-011394 (157 pgs) [Applicant believes that this information was available for download before the filing date of the present application.].

Website Information, CyberData Corporation, 011121/011120 Auxiliary Analog Speaker, downloaded from the internet on Sep. 18, 2020 at https://www.cyberdata.net/products/011120-011121 (60 pgs) [Applicant believes that this information was available for download before the filing date of the present application.].

Website Information, Viking Electronics, Model 40-IP, IP Ceiling Speaker for SIP Endpoint Paging or Multicast Paging/Background Music, downloaded from the internet on Sep. 18, 2020 at https://www.vikingelectronics.com/products/40-ip/ (38 pgs) [Applicant believes that this information was available for download before the filing date of the present application.].

Website Information, Advanced Network Devices, Round Ceiling IP Speaker, IPSCM-RMe, downloaded from the internet on Sep. 18, 2020 at https://www.anetd.com/our-products/ip-speakers/round-ceiling-ip-speaker/ (4 pgs) [Applicant believes that this information was available for download before the filing date of the present application.].

* cited by examiner

IP SPEAKER SYSTEM

BACKGROUND OF THE INVENTION

1. Field of the Invention

The present disclosure is generally related to audio communication systems and, more particularly, to network audio systems in which IP (Internet Protocol) speakers are powered by PoE (Power over Ethernet).

2. Description of Related Art

Audio communication systems are used in many different types of environments, such as schools, retail stores, restaurants, hospitals and health care facilities, commercial office spaces, government offices, transport terminals (e.g., air, bus, rail), manufacturing plants, and the like. Some systems are used to provide public address (PA) announcements to a large number of speakers for emergency (lockdown, evacuation, reverse evacuation, medical emergency, safety alert, etc.) and non-emergency applications. Other systems are used to play scheduled announcements, such as school announcements (class changes, recess, etc.), retail store announcements (store closing, etc.), healthcare announcements (visiting hours, etc.), and workplace announcements (shift changes, breaks, etc.). Yet other systems are used to stream background music, or to provide loud ringing to speakers located in noisy locations or where employees are wearing hearing protection.

Older audio communication systems use analog speakers to deliver audio in connection with the applications noted above. However, these analog speakers are prone to fail due to aging equipment, disconnected wires, and other reasons. More recently, network audio systems have been implemented in which audio communication is provided to IP (Internet Protocol) speakers, which can be powered by PoE (Power over Ethernet). One advantage of using IP speakers (vs. analog speakers) is that the network connection can facilitate supervision of individual IP speakers and allow notifications of any performance issues. This capability can be extremely useful and sometimes critical in maintaining a reliable system for delivering certain types of audio communications, such as emergency notifications. However, the cost of IP speakers far exceeds that of analog speakers, which is a disadvantage in implementations that require a large number of speakers.

BRIEF SUMMARY OF THE INVENTION

The present invention is directed to an Internet Protocol (IP) speaker that is connectable to one or a plurality of external analog speakers (e.g., one to three external analog speakers) located a distance from the IP speaker. All of the speakers are supervised and, in particular, the IP speaker supervises each of the external analog speakers. As such, the IP speaker can provide a notification if there is any change in the operational status (e.g., failure, disconnection, short, etc.) of one or more of the external analog speakers. Preferably, the IP speaker is powered by PoE (Power over Ethernet) and can operate at the maximum power level available without causing a reset of the port of the power sourcing equipment (PSE) or PoE switch port that supplies power to the IP speaker. The IP speaker and connected external analog speakers may be used for public address (PA) applications including voice paging, emergency alerting, loud ringing, bell scheduling, event notification, playing background music and the like.

An IP speaker system in accordance with one exemplary embodiment of the invention described herein comprises an IP speaker and one or more external analog speakers. The IP speaker comprises a central processing unit (CPU) and an internal driver. The CPU is configured to provide an audio data stream that is converted into a first analog audio signal for driving the internal driver and a second analog audio signal for driving one or more external drivers. Each of the one or more external analog speakers comprises one of the external drivers. The CPU of the IP speaker is configured to supervise the one or more external analog speakers so as to detect any change in the operational status (e.g., failure, disconnection, short, etc.) of one or more of the external analog speakers.

An IP speaker in accordance with another exemplary embodiment of the invention described herein comprises a CPU, a first amplifier, a second amplifier, and an internal driver. The CPU is configured to provide an audio data stream for transmission to the first amplifier and the second amplifier. The first amplifier is configured to output a first analog audio signal at a first power level for driving an internal driver of the IP speaker, and the second amplifier is configured to output a second analog audio signal at a second power level for driving one or more external drivers of one or more external analog speakers.

An IP speaker in accordance with another exemplary embodiment of the invention described herein comprises a CPU, a power circuit, and an internal driver. The CPU is configured to provide an audio data stream that is converted into a first analog audio signal for driving the internal driver and a second analog audio signal for driving one or more external drivers of one or more external analog speakers. The power circuit is configured to (i) receive electrical power transmitted over a network cable as an input power, (ii) provide an output power available for consumption by the IP speaker and the one or more external analog speakers, and (iii) measure the input power and decrease the output power if the measured input power exceeds a predetermined power level.

An IP speaker in accordance with yet another exemplary embodiment of the invention described herein comprises a CPU, a power circuit, a first amplifier, a second amplifier, and an internal driver. The CPU is configured to provide an audio data stream for transmission to the first amplifier and the second amplifier. The first amplifier is configured to output a first analog audio signal at a first power level for driving the internal driver, and the second amplifier is configured to output a second analog audio signal at a second power level for driving one or more external drivers of one or more external analog speakers. The CPU is also configured to supervise the one or more external analog speakers so as to detect any change in the operational status (e.g., failure, disconnection, short, etc.) of one or more of the external analog speakers. The power circuit is configured to (i) receive electrical power transmitted over a network cable as an input power, (ii) provide an output power available for consumption by the IP speaker and the one or more external analog speakers, and (iii) measure the input power and decrease the output power if the measured input power exceeds a predetermined power level.

Various other embodiments and features of the present invention are described in detail below, or will be apparent

DETAILED DESCRIPTION OF EXEMPLARY EMBODIMENTS

Figure 1:
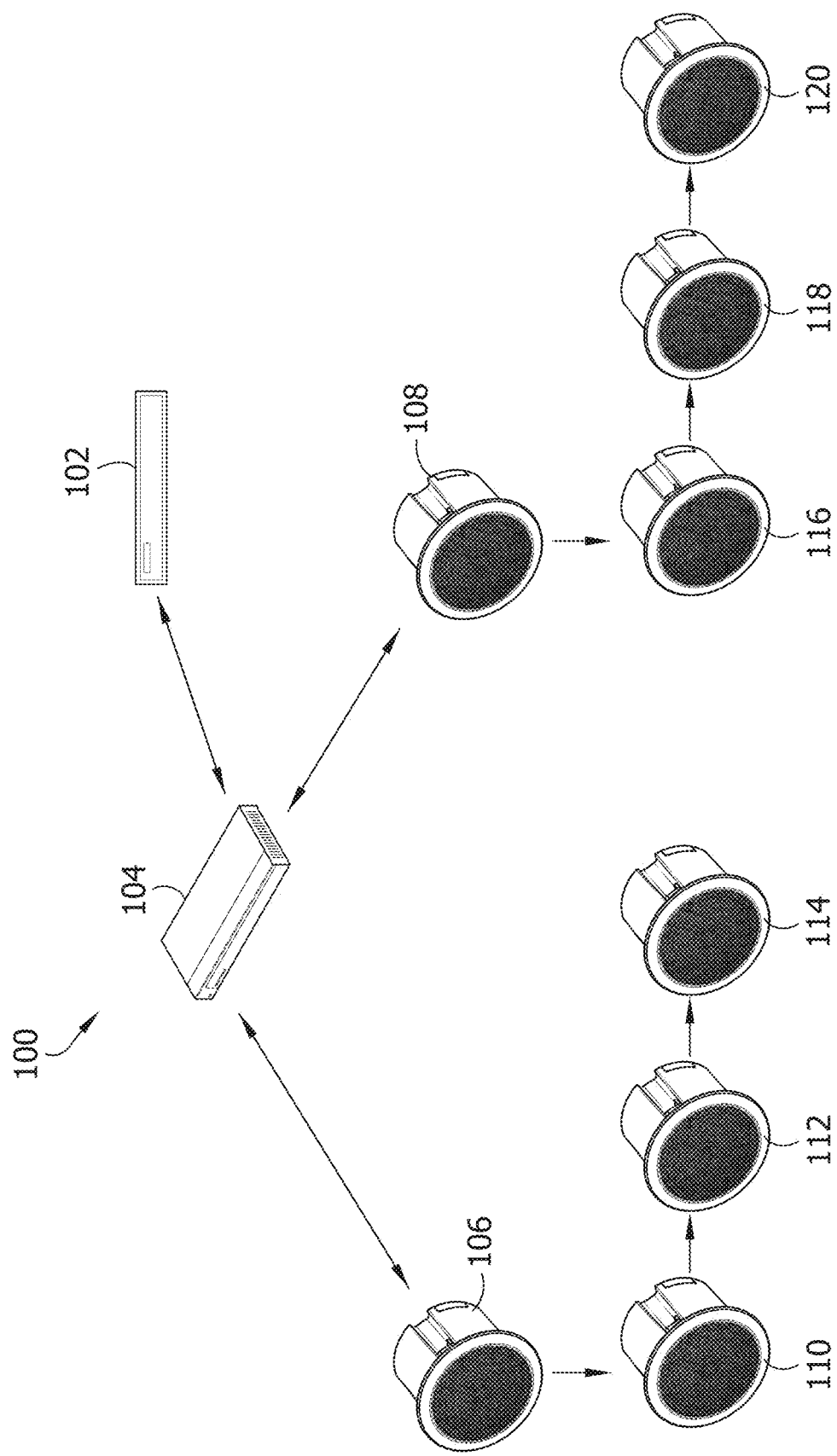
FIG. 1 is a block diagram of an audio communication system with IP speakers connected to external analog speakers in accordance with an embodiment of the invention.

The present invention is directed to an Internet Protocol (IP) speaker that is connectable to one or a plurality of external analog speakers located a distance from the IP speaker for use in public address (PA) applications including voice paging, emergency alerting, loud ringing, bell scheduling, event notification, playing background music and the like. While the invention will be described in detail below with reference to various exemplary embodiments, it should be understood that the invention is not limited to the specific system configurations or methodologies of these embodiments. In addition, although the exemplary embodiments are described as embodying several different inventive features, one skilled in the art will appreciate that any one of these features could be implemented without the others in accordance with the invention.

In the present disclosure, references to "one embodiment," "an embodiment," "an exemplary embodiment," or "embodiments" mean that the feature or features being described are included in at least one embodiment of the invention. Separate references to "one embodiment," "an embodiment," "an exemplary embodiment," or "embodiments" in this disclosure do not necessarily refer to the same embodiment and are also not mutually exclusive unless so stated and/or except as will be readily apparent to one skilled in the art from the description. For example, a feature, structure, function, etc. described in one embodiment may also be included in other embodiments, but is not necessarily included. Thus, the present invention can include a variety of combinations and/or integrations of the embodiments described herein.

Generally, the present disclosure describes an IP speaker that is connectable to one or a plurality of external analog speakers, all of which may be integrated into any SIP enabled telephone system or receive multicast from a network source (such as another IP speaker, multicast capable IP phone, media streaming service (e.g., internet radio) or mass notification software platform). The IP speaker and each of the external analog speakers may comprise a ceiling speaker, a wall speaker, a horn speaker, or any other type of IP speaker known in the art. The features of the present invention are particularly useful in implementations that utilize ceiling speakers due to the relative ease in which ceiling speakers may be installed and wired together in a drop ceiling.

In one aspect of the invention, the IP speaker supervises each of the external analog speakers. The supervision capability is provided by connecting a central processing unit (CPU) located in the IP speaker to a supervision circuit located in each of the external analog speakers. The CPU is configured to detect the quantity of external analog speakers that are connected to the IP speaker and then monitor the supervision circuits to detect any change in the operational status (e.g., failure, disconnection, short, etc.) of one or more of the external analog speakers. Upon detection of a problem, the CPU provides a notification to the network enabled supervision capability so that a technician can inspect the external analog speakers to identify the cause of the problem. A technician may also remotely view time stamped history logs stored in the CPU memory that may provide additional information in the case of intermittent faults.

In another aspect of the invention, the IP speaker is powered by PoE (Power over Ethernet). The IP speaker incudes a power circuit that isolates the input power received over the network from the output power available for consumption by the IP speaker and any connected external analog speakers. The power circuit is configured to measure the input power and decrease the output power if the measured input power exceeds a predetermined power level. As such, the IP speaker can operate at the maximum power level available without causing a reset of the port of the PoE switch that supplies power to the IP speaker.

In yet another aspect of the invention, the IP speaker includes two amplifiers, i.e., a first amplifier configured to drive an internal driver of the IP speaker and a second amplifier configured to drive one or more external drivers of one or more external analog speakers. The CPU of the IP speaker is configured to control the power level of the audio signals output by the first and second amplifiers so as to equalize the amount of audio power provided to each of the internal driver and external drivers. As such, the IP speaker provides automatic equalization of audio power between the IP speaker and each of the external analog speakers.

Various IP speakers and external analog speakers that are integrated into different audio communication systems will now be described. Of course, it should be understood that these IP speakers, external analog speakers, and audio communication systems are merely provided as exemplary embodiments and that other types of IP speakers, external analog speakers, and audio communication systems may also be used within the scope of the invention.

System Overview

Referring to FIG. 1, an audio communication system that may be used in some embodiments of the present invention is generally indicated by reference number 100. System 100 includes a SIP server 102 connected to a PoE switch 104, both of which are well known to those skilled in the art. PoE switch 104 is connected to each of IP speakers 106 and 108 via any suitable Ethernet cable, such as a Category-5 cable or Category-6 cable. In this embodiment, each of IP speakers 106 and 108 operates as a SIP endpoint that preferably supports secure SIP using TLS (Transport Layer Security) and SRTP (Secure Real-time Transport Protocol). One skilled in the art will appreciate that, in other embodiments, each of IP speakers 106 and 108 operate as a receiver for receiving a multicast audio stream from a SIP endpoint or other network source such as another IP speaker, multicast capable IP phone, media streaming service, or mass notification software platform.

Each of IP speakers 106 and 108 is powered from PoE switch 104. Preferably, the signaling between PoE switch 104 and each of IP speakers 106 and 108 is provided in accordance with IEEE 802.3af (i.e., PoE that provides up to 15.4 watts of DC power on each port of PoE switch 104) or IEEE 802.3at (i.e., PoE+ that provides up to 25.5 watts of DC power on each port of PoE switch 104). Of course, the signaling may be provided in accordance with other standards, such as IEEE 802.3bu (i.e., PoDL) or IEEE 802.3bt (i.e., 4PPoE). In some embodiments, PoE switch 104 is replaced with a network switch that does not have PoE capabilities and a separate PoE injector, or any other type of power sourcing equipment (PSE) known in the art.

IP speaker 106 is connected to three external analog speakers 110, 112, 114 that are wired in series to the output of IP speaker 106 via any suitable cable, such as a category-5, category-5e, or category-6 unshielded twisted pair network cable (either 23 or 24 AWG). Similarly, IP speaker 108 is connected to three external analog speakers 116, 118 and 120 that are wired in series to the output of IP speaker 108 via any suitable cable, such as a category-5, category-5e, or category-6 unshielded twisted pair network cable (either 23 or 24 AWG). In this embodiment, the cable comprises an eight-wire cable in which three wire pairs are used to transmit analog audio signals and one wire pair is used for supervision, as described below.

While system 100 shown in FIG. 1 includes two IP speakers each of which is connected to three external analog speakers, it should be understood that the system 100 may include any number of IP speakers and external analog speakers depending on the power and number of ports provided by PoE switch 104 and the power requirements of the speakers. In most embodiments, each IP speaker will be connected to either one, two or three external analog speakers, although a greater number of external analog speakers may be used within the scope of the invention. The configuration of an exemplary IP speaker and an exemplary external analog speaker will be described in greater detail below.

System 100 shown in FIG. 1 is a voice over IP (VoIP) telephone system in which the SIP server 102 is located on the customer premise. It should be understood that other types of SIP enabled telephone systems may also utilize the IP speakers and external analog speakers of the present invention, such as a hosted VoIP telephone system in which the PoE switch is connected through a router to a SIP server residing on the cloud. One skilled in the art will appreciate that SIP enabled telephone systems may be used to support a variety of different public address (PA) applications including voice paging, emergency alerting, loud ringing, bell scheduling, event notification, playing music and the like. System 100 may also include any unicast or multicast network source such as another IP speaker, multicast capable IP phone, media streaming service, or mass notification software platform. In some cases, there may be no audio streamed at all, with the IP speakers triggered to play a sound file stored in memory by a SIP ring invite message, API or the like. Some examples of these applications will be described further below in connection with FIGS. 7 and 8.

Speaker Configurations

Figure 2A:
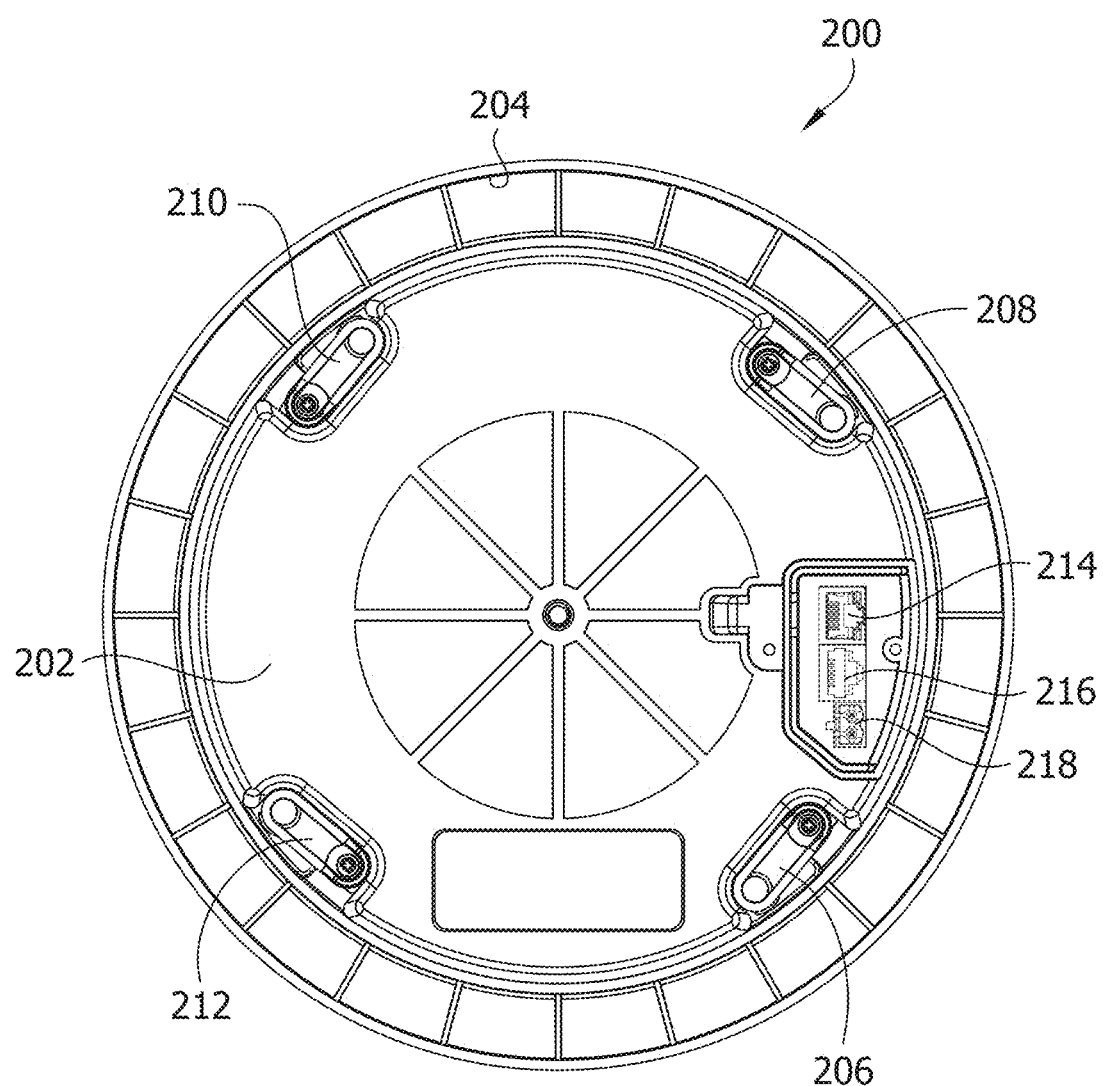
FIG. 2A is a rear view of an IP speaker (with the protective wiring cover removed) in accordance with an embodiment of the invention.
Figure 2B:
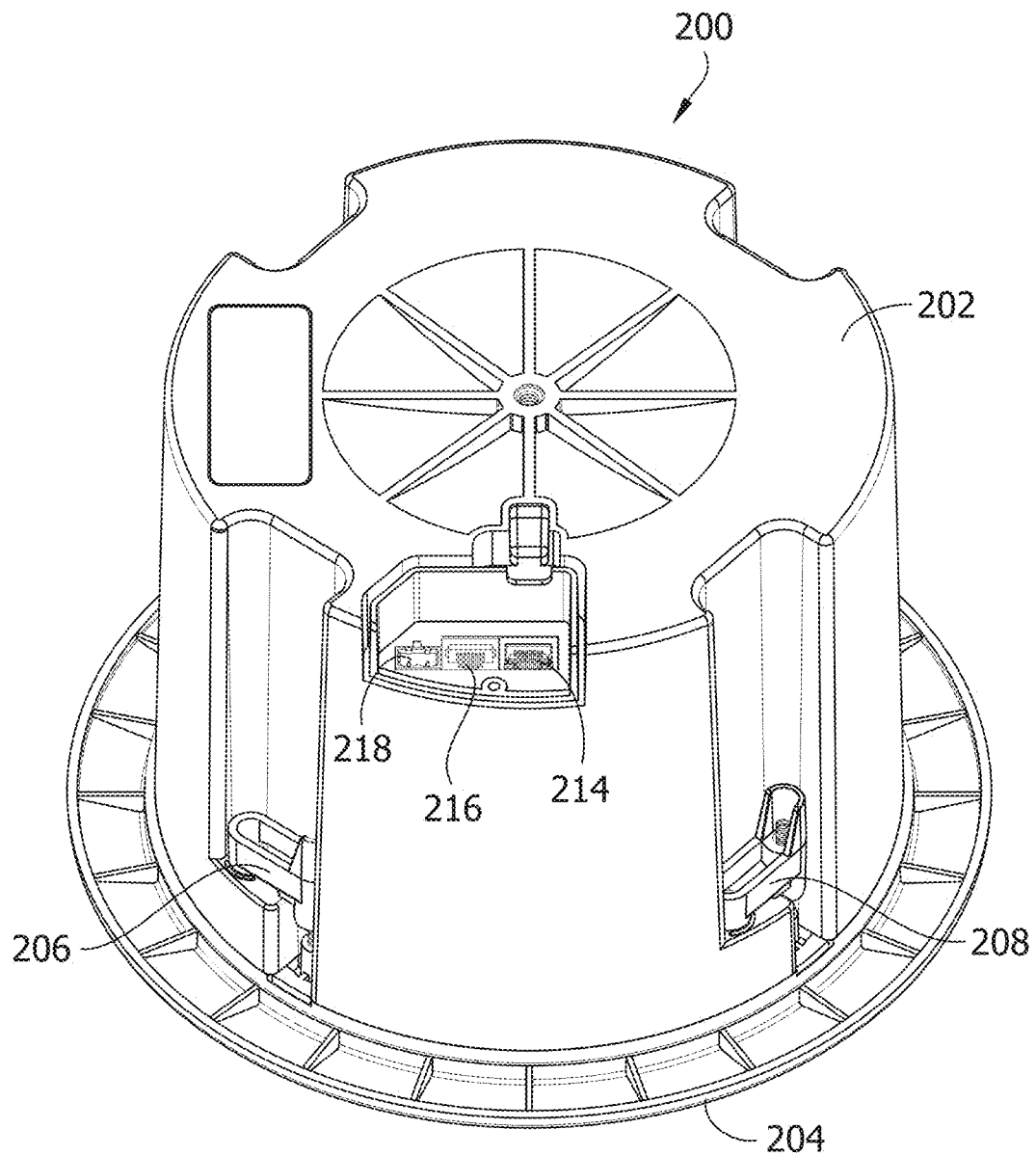
FIG. 2B is a perspective view of the IP speaker shown in FIG. 2A.

Referring to FIGS. 2A and 2B, an IP speaker in accordance with one embodiment of the present invention is generally indicated by reference number 200. IP speaker 200 includes an enclosure 202 that supports a front speaker grill (not shown in FIGS. 2A and 2B) with trim ring 204. Four clamps 206, 208, 210 and 212 are provided to enable mounting of IP speaker 200 to a ceiling, such as by inserting enclosure 202 through a hole in a ceiling tile and clamping it in place.

Enclosure 202 houses all of the internal circuitry, described below, and also provides access to various connections, including an input connection 214, an output connection 216, and a pluggable terminal block 218 for relay input and/or relay output. Terminal block 218 also provides a power source and current measurement utilizing CPU A/D to support accessories such as a remote call switch, a remote volume control, and the like, as known in the art. In this embodiment, input connection 214 comprises an RJ-45 jack for receiving the RJ-45 connector of an Ethernet cable coming in from the network, and output connection 216 comprises an RJ-45 jack for receiving the RJ-45 connector of a cable going out to an external analog speaker 300 (described below in connection with FIGS. 3A and 3B). Of course, other types of jacks and connectors may be used within the scope of the invention. A protective wiring cover (not shown in FIGS. 2A and 2B) may be placed over input connection 214, output connection 216, and terminal block 218 once the appropriate connections have been made.

Figure 3A:
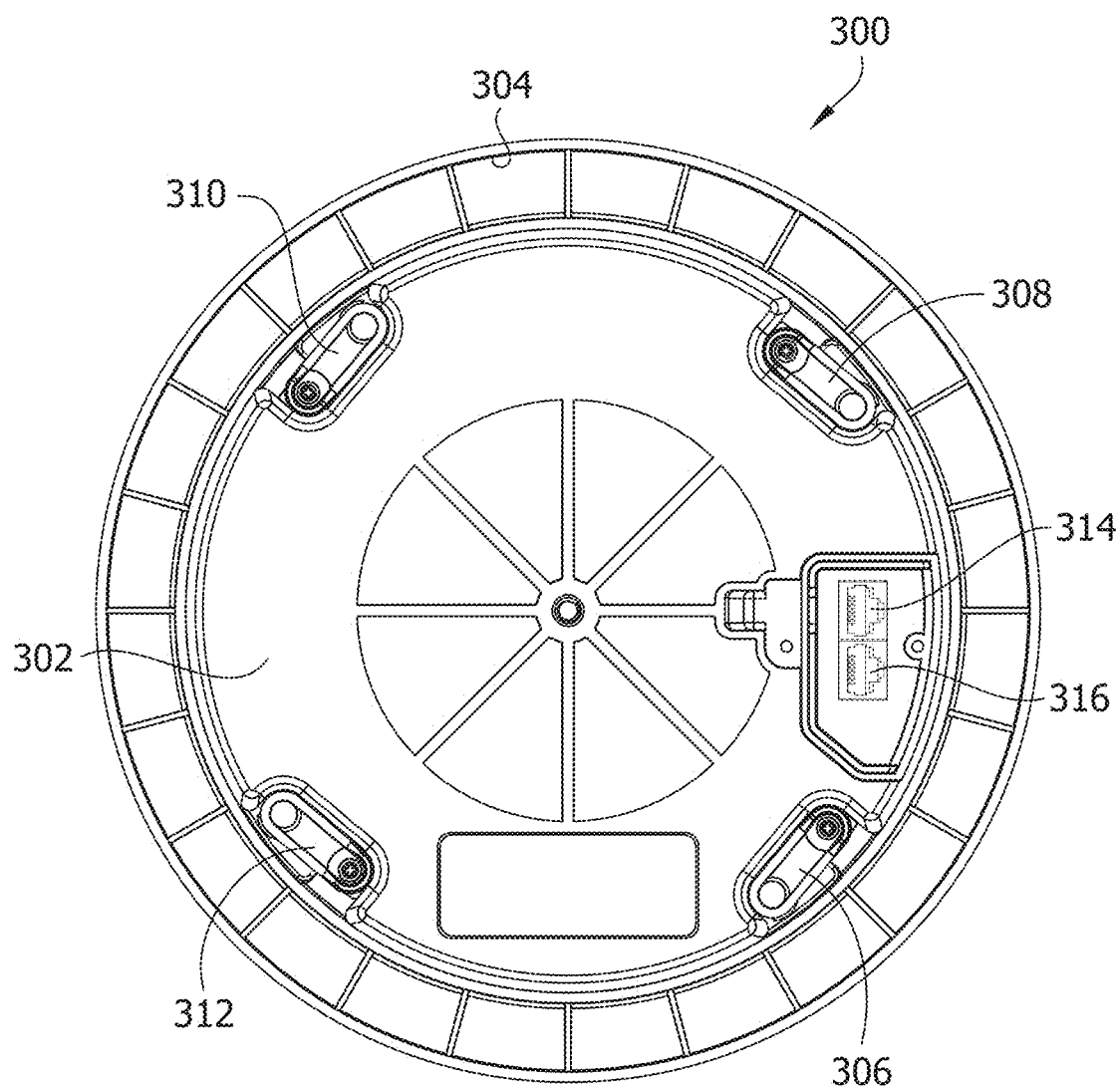
FIG. 3A is a rear view of an external analog speaker (with the protective wiring cover removed) in accordance with an embodiment of the invention.
Figure 3B:
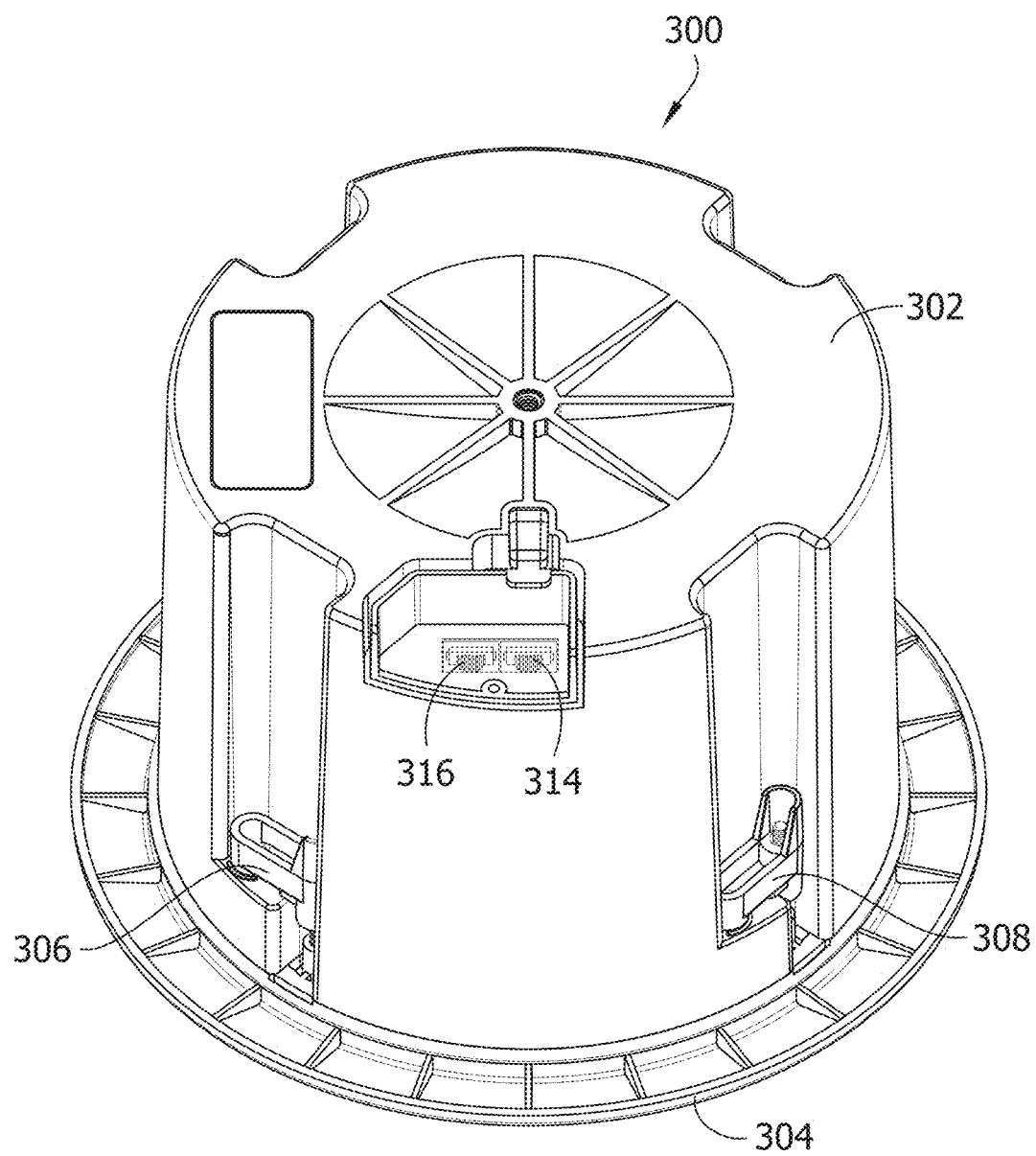
FIG. 3B is a perspective view of the external analog speaker shown in FIG. 3A.

Referring to FIGS. 3A and 3B, an external analog speaker in accordance with one embodiment of the present invention is generally indicated by reference number 300. Analog speaker 300 includes an enclosure 302 that supports a front speaker grill (not shown in FIGS. 3A and 3B) with trim ring 304. Four clamps 306, 308, 310 and 312 are provided to enable mounting of analog speaker 300 to a ceiling, such as by inserting enclosure 302 through a hole in a ceiling tile and clamping it in place.

Enclosure 302 houses all of the internal circuitry, described below, and also provides access to various connections, including an input connection 314 and an output connection 316. In this embodiment, input connection 314 comprises an RJ-45 jack for receiving the RJ-45 connector of an incoming cable, and output connection 316 comprises an RJ-45 plug for receiving the RJ-45 connector of an outgoing cable (or a termination plug if there are no additional analog speakers to be connected). Of course, other types of jacks and connectors may be used within the scope of the invention. A protective wiring cover (not shown in FIGS. 3A and 3B) may be placed over input connection 314 and output connection 316 once the appropriate connections have been made.

IP speaker 200 shown in FIGS. 2A and 2B is identical in appearance and performance to analog speaker 300 shown in FIGS. 3A and 3B, including the activation of a blue light emitting diode (LED) to indicate when each speaker is operating in an active mode, as described below. Of course, in other embodiments, the IP speaker and analog speaker(s) may have different appearances and/or performances in accordance with the present invention.

The connection of IP speaker 200 to one or more external analog speakers 300 will now be described with reference to IP speaker 106 and external analog speakers 110, 112 and 114 shown in FIG. 1. First, the Ethernet cable coming in from the network is connected to the input connection of IP speaker 106. Then, a cable is run from the output connection of IP speaker 106 to the input connection of analog speaker 110, another cable is run from the output connection of analog speaker 110 to the input connection of analog speaker 112, and another cable is run from the output connection of analog speaker 112 to the input connection of analog speaker 114. Finally, a termination plug is inserted into the output connection of analog speaker 114 to complete the circuit. It can be appreciated that this same process is used to connect IP speaker 108 to external analog speakers 116, 118 and 120. In other embodiments, a similar process is used to connect an IP speaker to one or a plurality of external analog speakers and, in each of these cases, a termination plug is inserted into the output connection of the last analog speaker to complete the circuit.

Figure 4:
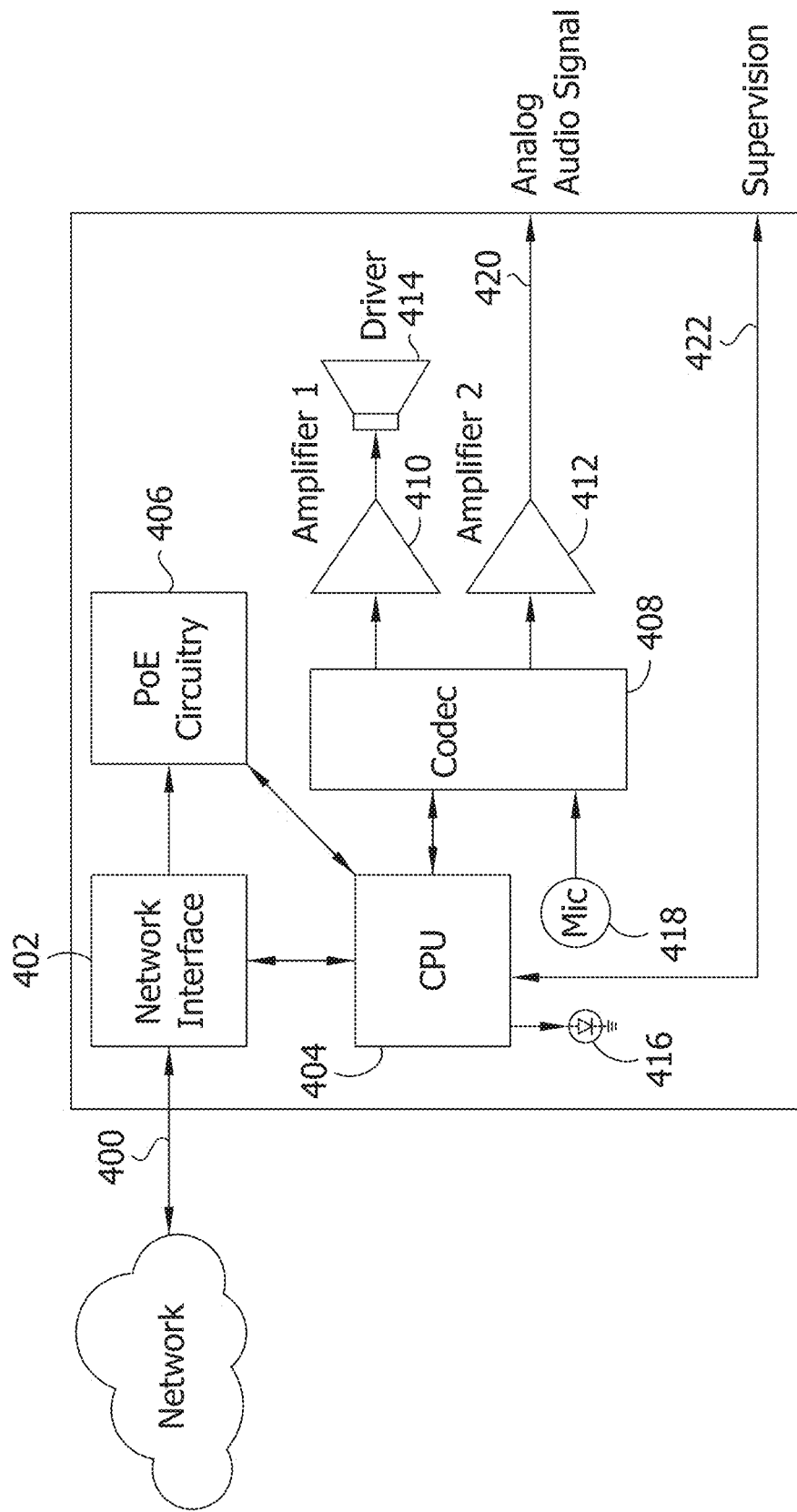
FIG. 4 is a block diagram of the internal circuitry of the IP speaker shown in FIGS. 2A and 2B.

Referring now to FIG. 4, the internal circuitry of IP speaker 200 is shown in block diagram form. As can be seen, the Ethernet cable 400 coming in from the network is terminated at a network interface 402 configured to enable the receipt/transmission of data and the receipt of electrical power from the network. In this embodiment, network interface 402 comprises an RJ-45 jack connected to a Physical Layer (PHY), which communicates with a central processing unit (CPU) 404 using a media-independent interface (MII) bus for the receipt/transmission of data and provides electrical power to a PoE circuit 406. In this embodiment, the RJ-45 jack contains isolation magnetics as well as common mode chokes and a "Bob Smith" termination for improved electromagnetic compatibility (EMC) performance. Also, a suitable PHY is the Si3402-C 10/100 Mbps transceiver integrated circuit (IC) available from Silicon Laboratories, Inc. of Austin, Tex. Of course, other components may also be used within the scope of the present invention.

In this embodiment, CPU 404 is configured to support multiple page extensions (e.g., up to fifty), multiple emergency or non-emergency alert extensions (e.g., up to ten), and multiple ring extensions (e.g., up to ten). CPU includes an internal memory (e.g., 1 GB memory) that stores audio files associated with the alert extensions and ring extensions. In this embodiment, the files comprise configurable WAV or MP3 files, although other audio file formats may also be used in accordance with the present invention. Of course, it should be understood that any number of page, alert and ring extensions may be provided as required for a particular implementation.

As noted above, in some embodiments, IP speaker 200 operates as a SIP endpoint. In this case, if a SIP call is made to one of the page extensions, CPU 404 auto-answers the call to enable live voice paging. At this point, a voice announcement is transmitted as an audio data stream from the sender (e.g., a VoIP phone on the network) to network interface 402 and transmitted to CPU 404. If a SIP call is made to one of the emergency or non-emergency alert extensions, CPU 404 selects the audio file associated with the extension from its internal memory (e.g., a notification alert for safety, security, or an emergency event or an informational announcement) and activates the audio file to generate an audio data stream. Similarly, if a SIP call is made to one of the ring extensions, CPU 404 selects the audio file associated with the extension from its internal memory (e.g., a ring tone) and activates the audio file to generate an audio data stream.

In other embodiments, IP speaker 200 operates as a receiver for receiving a multicast audio data stream transmitted from a SIP endpoint, multicast capable IP phone, media streaming service or mass notification software platform. It can be appreciated that the audio data stream may comprise a live voice announcement, a recorded notification alert or informational announcement, or a recorded ring tone. Of course, other types of audio streamed from a network source to IP speaker 200 are also within the scope of the present invention.

Next, CPU 404 outputs the audio data stream to an audio codec 408, and also transmits a control signal to activate an LED 416 indicating that IP speaker 200 is operating in an active mode. For example, CPU 404 may activate the LED 416 when the speaker is paging and/or may flash the LED 416 to indicate a talk-back mode. CPU 404 may also briefly flash the LED 416 on a periodic basis (e.g., once every minute) to provide a visual indication of normal and healthy status. The LED 416 may also be activated manually through a web interface, supervision method or API for identifying specific IP speakers by IP address, MAC address or status. It will be seen that an LED 610 (FIG. 6) of each external analog speaker 300 is also activated by CPU 404 to indicate that external analog speaker 300 is operating in an active mode.

CPU 404 may apply compression to the audio data stream prior to transmission to audio codec 408. Preferably, audio codec 408 supports wideband audio in accordance the G.722 ITU standard in order to provide high speech clarity and intelligibility. Audio codec 408 also preferably supports the Opus format to provide enhanced music quality. While audio codec 408 is provided as a standalone component in this embodiment, one skilled in the art will understand that CPU 404 may include an internal audio codec. Alternatively, CPU 404 may use pulse width modulation (PWM) to generate an analog signal that is provided to the amplifiers described below, in which case audio codec 408 would not be required.

Audio codec 408 is configured to convert the audio data stream into an analog audio signal that is output to both a first amplifier 410 and a second amplifier 412. In this embodiment, first and second amplifiers 410 and 412 each comprise a Class D amplifier. First amplifier 410 is configured to amplify the analog audio signal to a first power level for driving an internal driver 414. Second amplifier 412 is configured to amplify the analog audio signal to a second power level so as to provide a signal 420 for driving one or more external drivers 604 of one or more external analog speakers 300 (described below in connection with FIG. 6). Of course, other types of amplifiers may be used within the scope of the present invention, such as a digital amplifier that receives a digital input. For example, CPU 404 may provide the audio data stream as input to digital amplifiers, in which case audio codec 408 would not be required.

The power level of the analog audio signal may be controlled in a variety of different ways. For example, CPU 404 may control the power level of the analog audio signal generated by audio codec 408 by adjusting the codec settings through an I²C (Inter-Integrated Circuit) connection. Also, a microphone 418 connected to audio codec 408 may be used for ambient noise monitoring (as well as talkback), e.g., the audio codec 408 will adjust the power level of the analog audio signal in response to the detected level of ambient noise. For implementations in which IP speaker 200 and one or more external analog speakers 300 are used to play music, it is possible to monitor ambient noise by momentarily muting IP speaker 200 while allowing music to play in the external analog speakers 300 during which time IP speaker 200 measures the ambient noise without the interference of playing music to internal driver 414. Alternatively, it is possible to remove the music from the microphone input through digital signal processing in IP speaker 200.

CPU 404 may also implement automatic gain control (AGC) to control the power levels of the amplified audio signals used to drive internal driver 414 and any external drivers 604, respectively. In this embodiment, the gain control is performed with digital signal processing in CPU 404. CPU 404 also has control over gains in audio codec 408 and amplifiers 420 and 412. If there are no external analog speakers connected to IP speaker 200, then CPU 404 disables second amplifier 412 and all available audio power is provided to internal driver 414. However, if one or more external analog speakers 300 are connected to IP speaker 200, then CPU 404 adjusts the audio output levels from audio codec 408 so as to equalize the amount of audio power provided to internal driver 414 and the external driver(s) 604. In this embodiment, CPU 404 detects the quantity of external analog speakers 300 connected to IP speaker 200 using a supervision circuit, as described below.

In order to illustrate the equalization of audio power between internal driver 414 and the external driver(s) 604, assume that the available audio power is 16 watts. If there is one external analog speaker 300 connected to IP speaker 200, then CPU 404 will control the audio output levels from audio codec 408 and adjust the gains of amplifiers 410 and 412 so as to provide 8 watts of audio power to internal driver 414 and 8 watts of audio power to the external driver 604. However, if there are three external analog speakers 300 connected in series to IP speaker 200, then CPU 404 will control the audio output levels from audio codec 408 and adjust the gains of amplifiers 410 and 412 so as to provide 4 watts of audio power to internal driver 414 and 12 watts of audio power to the external drivers 604 (which is equally shared as 4 watts per external driver 604).

Figure 5:
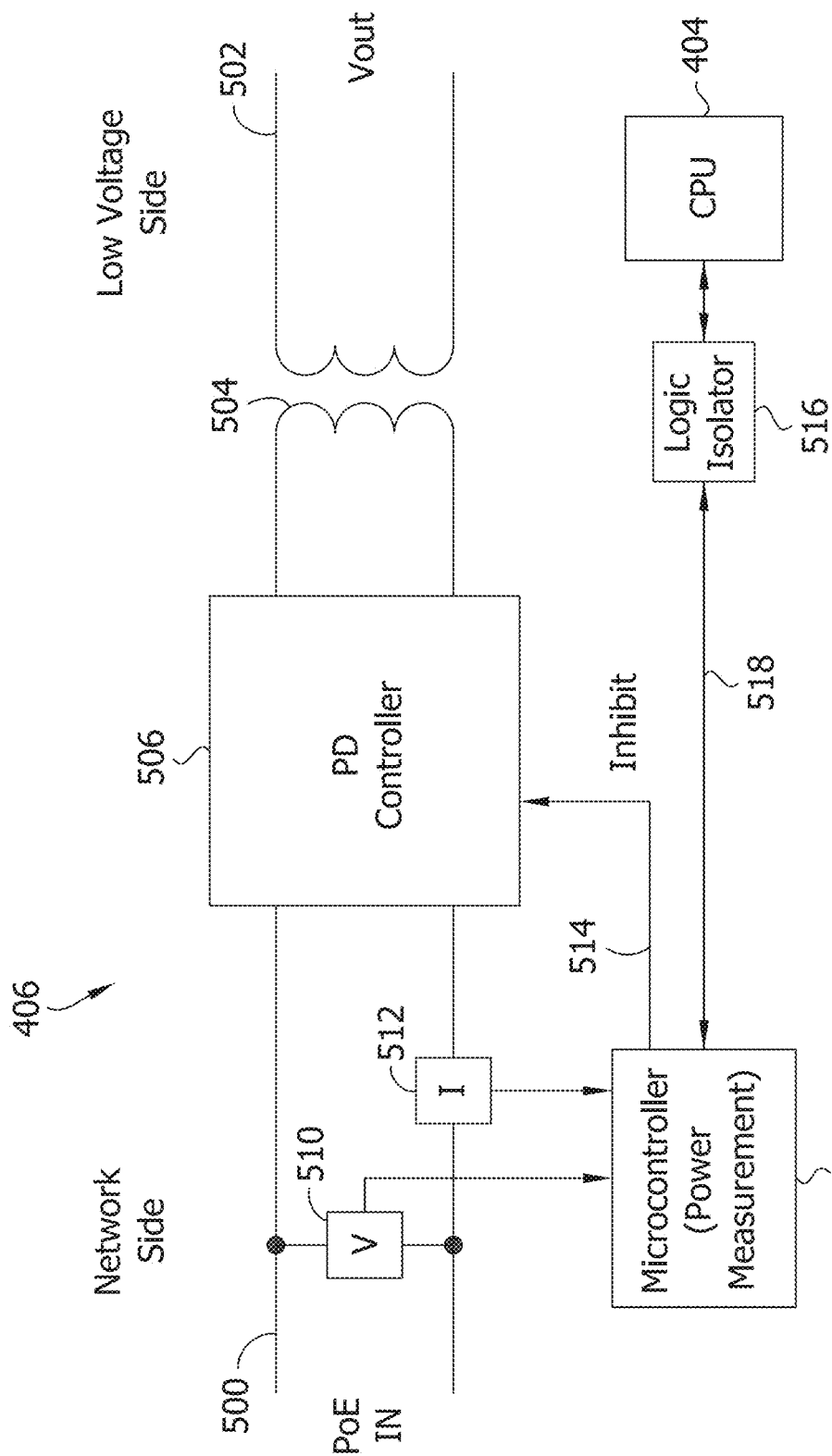
FIG. 5 is a block diagram of the power circuit shown in FIG. 4.

As noted above, network interface 402 transmits the electrical power received from PoE switch 104 (FIG. 1) to PoE circuit 406, the components of which are shown in FIG. 5. As can be seen, PoE circuit 406 is configured to receive input power on a network side 500 of the circuit and provide output power on a low voltage side 502 of the circuit. It should be understood that the output power comprises the power available for consumption by IP speaker 200 and external analog speaker(s) 300. In this embodiment, 24 Vdc output power from PoE circuit 406 is used to power amplifiers 410 and 412, and a voltage regulator provides 5V to a power management integrated circuit (PMIC) which in turn supplies 3.3V and 1.8V to the PHY of network interface 402, CPU 404 including its memory (random access memory (RAM) and flash memory), and audio codec 408. It should be understood that the power connections are not shown in the block diagram of FIG. 4 for purposes of clarity. Of course, other output power levels may be used within the scope of the present invention, i.e., the invention is not limited to the use of 24 Vdc output power.

PoE circuit 406 includes a powered device (PD) controller 506 that isolates the input power from the output power. In this embodiment, PD controller 506 is the LT4276 PD controller available from Linear Technology Corporation of Milpitas, Calif. (a subsidiary of Analog Devices, Inc. of Norwood, Mass.), which uses a 250 kHz switching regulator power supply to generate the 24 Vdc output efficiently through a small isolation transformer 504.

It should be understood that the maximum input current to PoE circuit 406 is not known insofar as it is dependent on the voltage provided by PoE switch 104 (which is not known to IP speaker 200) and which cannot be measured without knowing the resistance of the Ethernet cable connecting PoE switch 104 and IP speaker 200 (which is also not known to IP speaker 200). Thus, if the system is operated at full scale, the power consumed by IP speaker 200 and external analog speaker(s) 300 may exceed the power limit set forth in the applicable IEEE standard, e.g., a maximum power of 12.95 watts for IEEE 802.3af (i.e., PoE) and a maximum power of 25.50 watts for IEEE 802.3at (i.e., PoE+). If the power consumption exceeds the applicable power limit, it may cause a reset of the port of PoE switch 104. However, it is also desirable to maximize the power to the speakers for maximum sound output.

In order to address this problem, PoE circuit 406 includes a microcontroller 508 connected to PD controller 506. Microcontroller 508 is connected to a voltage measurement circuit 510 configured to measure the voltage on the network side 500 of PoE circuit 406. Microcontroller 508 is also connected to a current measurement circuit 512 configured to measure the current on the network side 500 of PoE circuit 406. Voltage measurement circuit 510 transmits the measured voltage to microcontroller 508, and current measurement circuit 512 transmits the measured current to microcontroller 508.

Microcontroller 508 uses the voltage and current measurements to calculate the power provided on the network side 500 of PoE circuit 406 (i.e., P=IV) and compares it to the applicable power limit. The power limit is known by PD controller 506 and communicated directly to microcontroller 508, and microcontroller 508 also communicates the power limit to CPU 404 via a logic isolator 516 (e.g., optocouplers). In this embodiment, microcontroller 508 continuously calculates the input power to PoE circuit 406 so as to be able to immediately detect an over-power condition. Specifically, if the calculated power is less than or equal to the power limit, then microcontroller 508 allows PD controller 506 to pass the full input power to the low voltage side 502 of PoE circuit 406. However, if the calculated power is greater than the power limit, then microcontroller 508 transmits a signal 514 to PD controller 506 in order to immediately inhibit PoE circuit 406 from exceeding the power limit. Upon receipt of signal 514, the DC-DC converter within PD controller 506 is essentially turned off, which decreases the output voltage to the low voltage side 502 of PoE circuit 406, and this state is maintained until the measured input power no longer exceeds the power limit. Thus, microcontroller 508 is able to control PD controller 506 so as to provide the maximum output voltage and thereby maximize the power to the speakers for maximum sound output.

It can be appreciated that an over-power condition may cause distortion in the output of amplifiers 410 and 412. Thus, if the calculated power is greater than the applicable power limit, then microcontroller 508 communicates with CPU 404 through logic isolator 516 to provide notification of the over-power condition (e.g., by transmitting the voltage measurement, current measurement, and calculated power to CPU 404). It should be understood that this occurs at the same time that microcontroller 508 is acting to inhibit PD controller 506. In response, CPU 404 attenuates the audio data stream so that maximum power can be achieved without distortion.

Further, a circuit (not shown) may optionally be deployed to detect a drop in the output voltage of PoE circuit 406 and, in response, attenuate the analog audio signal between audio codec 408 and amplifiers 410 and 412 until the output voltage of PoE circuit 406 returns to 24 Vdc. This circuit is used to prevent distortion in the output of amplifiers 410 and 412 until CPU 404 can digitally reduce the audio level.

It should be understood that CPU 404 does not act as quickly as microcontroller 508 and, thus, microcontroller 508 will inhibit PD controller 506 before CPU 404 has time to react. Thus, microcontroller 508 provides a first line of defense against exceeding the applicable power limit and possibly causing PoE switch 104 to turn off power to the port assigned to IP speaker 200. One skilled in the art will appreciate that losing power to IP speaker 200 is problematic at any time, but particularly if it occurs when an emergency announcement is being made.

One skilled in the art will understand that PoE circuit 406 shown in FIG. 5 is provided as an example and that other circuit configurations may be used within the scope of the present invention. For example, in some embodiments, PoE circuit 406 also includes a second microcontroller connected to a voltage measurement circuit and a current measurement circuit located on the low voltage side 502 of PoE circuit 406. This arrangement would enable the second microcontroller to calculate the power on the low voltage side and transmit the voltage measurement, current measurement, and calculated power to CPU 404. CPU 404 could then analyze this information in conjunction with the information transmitted by microcontroller 508 to provide self-diagnostic and error-reporting capabilities in the event that CPU 404 detects a hardware issue. As another example, in some embodiments, the input power measurement could be achieved by measuring the output power on the low voltage side 502 of PoE circuit 406 and calculating the input power with knowledge of the efficiency of PoE circuit 406. However, this method is not as accurate as measuring the actual input power on the network side 500 of PoE circuit 406 with the ability to instantaneously limit the power input by inhibiting PD controller 506.

Figure 6:
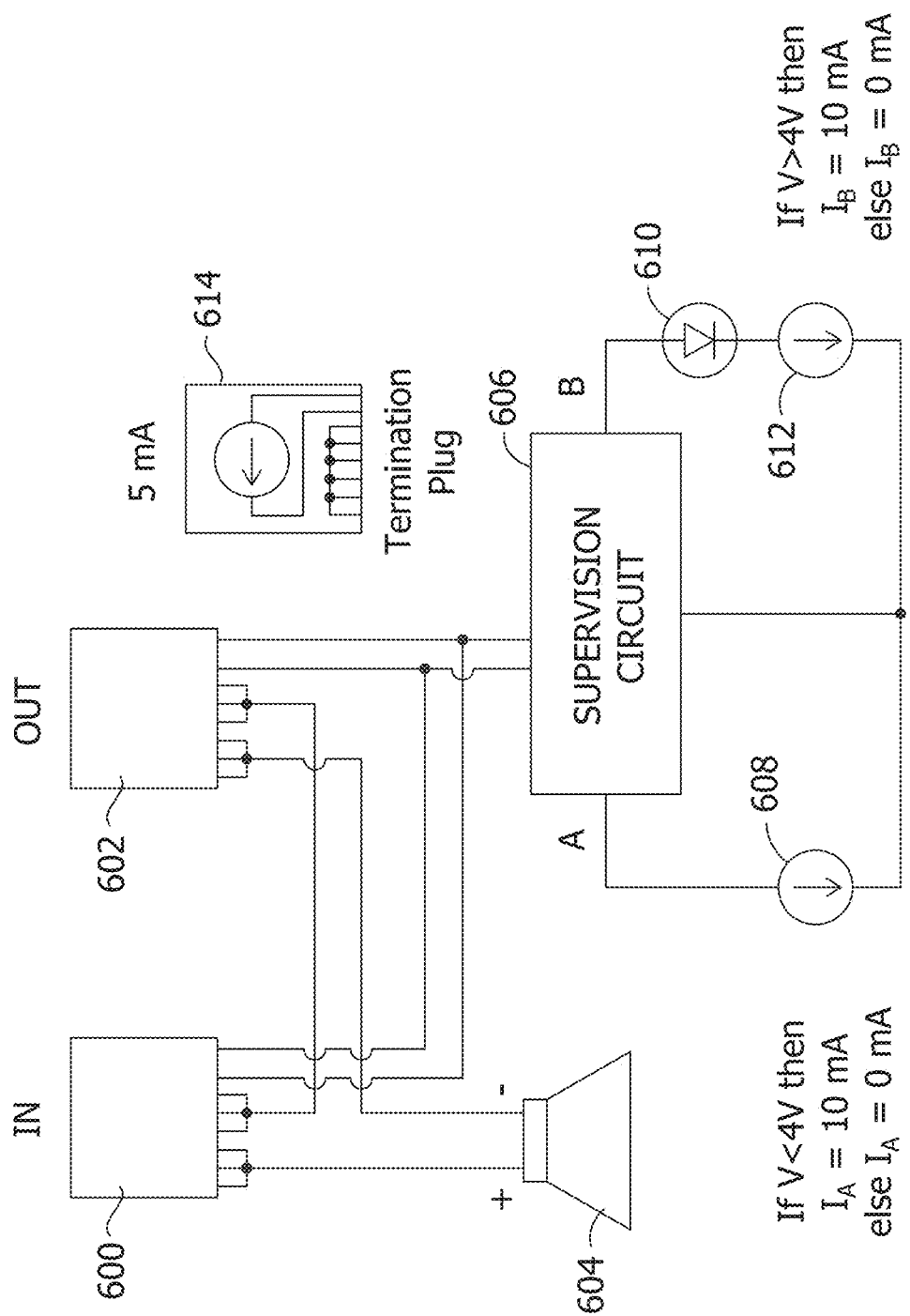
FIG. 6 is a block diagram of the internal circuitry of the external analog speaker shown in FIGS. 3A and 3B.

Turning now to FIG. 6, the internal circuitry of external analog speaker 300 is shown in block diagram form. As described above, analog speaker 300 includes an input connection 600 that is connectable to an incoming cable and an output connection 602 that is connectable to an outgoing cable (or a termination plug 614 if there are no additional analog speakers to be connected). Analog speaker 300 also includes an external driver 604 that is driven by second amplifier 412 of IP speaker 200. It can be appreciated that external driver 604 has the same or similar configuration as internal driver 414 of IP speaker 200.

Referring to FIGS. 4 and 6, it can be seen that a supervision pair 422 connects CPU 404 of IP speaker 200 to a supervision circuit 606 of external analog speaker 300. IP speaker 200 is fully supervisable using Simple Network Management Protocol (SNMP), Real-time Transport Protocol (RTCP), RESTful API, polling, and/or by various mass notification software platforms known in the art (e.g., the InformaCast® alert notification system available from Singlewire Software LLC of Madison, Wis. or the Revolution emergency notification system available from Syn-Apps, LLC of Portland, Oreg.). Supervision pair 422 enables IP speaker 200 to supervise the external analog speaker(s) 300 and thereby extend the supervision to external analog speaker(s) 300 that would not otherwise be supervised.

As shown in FIG. 6, external analog speaker 300 includes a supervision circuit 606 connected to a first constant current source 608 which is in parallel with an LED 610 and a second constant current source 612. When the speakers are in idle mode, CPU 404 provides a 3-volt DC output on supervision pair 422. Supervision circuit 606 is configured to direct all of the current to constant current source 608 when the voltage is less than 4 volts so as to provide a 10 milliamp current draw. When the speakers are in active mode, CPU 404 provides a 5-volt DC output on supervision pair 422. Supervision circuit 606 is configured to direct all of the current to constant current source 612 when the voltage is greater than 4 volts so as to provide a 10 milliamp current draw (i.e., the 10 milliamp current draw is maintained in active mode by activating LED 610). Thus, it can be appreciated that external analog speaker 300 maintains a 10 milliamp current draw in both the idle and active modes. Further, if termination plug 614 is inserted into output connection 602 to complete the series speaker circuit, external analog speaker 300 provides an additional 5 milliamp current draw.

CPU 404 is configured to determine the total current draw on supervision pair 422 to detect the presence and quantity of external analog speakers 300 that are connected to IP speaker 200. If the total current draw is 0 milliamps, then it can be determined that no external analog speakers are connected to IP speaker 200. If the total current draw is 15 milliamps, then it can be determined that one external analog speaker 300 is connected to IP speaker 200. If the total current draw is 25 milliamps, then it can be determined that two external analog speakers 300 are connected to IP speaker 200 (i.e., 10 milliamps from the first speaker and 15 milliamps from the second speaker). If the total current draw is 35 milliamps, then it can be determined that three external analog speakers 300 are connected to IP speaker 200 (i.e., 10 milliamps from each of the first and second speakers and 15 milliamps from the third speaker). It should be understood that additional external analog speakers 300 may be detected in the same manner.

It should be understood that CPU 404 can send audio through audio codec 408 to first and second amplifiers 410 and 412 either separately or simultaneously. In some embodiments, CPU 404 is configured to periodically play a test file only through amplifier 412 to determine if the power being consumed by external analog speaker(s) 300 is consistent with the quantity of external analog speaker(s) 300 detected over supervision pair 422.

Once the quantity of external analog speakers 300 has been determined, CPU 404 is configured to monitor the total current draw to detect whether the total current draw deviates from (either less than or greater than) a previous total current draw. This can be done in a number of different ways, such as by polling supervision pair 422 on a periodic basis (e.g., every 10 milliseconds) to determine if the current poll is equal to or within a permitted variance of the last poll. In this embodiment, the permitted variance is ±2.5 mA and averaged to isolate any noise from the parallel audio wires and electrical noise in the environment. Filtering capacitors may also be used to remove alternating current (AC). If the current poll is equal to or within a permitted variance of the last poll, then CPU 404 does nothing and the monitoring process continues. However, if a sufficient variance is detected, CPU 404 reports the event via SNMP or other any of the other supervision protocols described above. It can be appreciated that a drop or increase in the total current draw indicates a failure, disconnection, short, or other change in the operational status of one or more of the external analog speakers. Upon receipt of the notification, a technician can inspect external analog speaker(s) 300 to identify the cause of the problem. A technician may also remotely view time stamped history logs stored in the CPU memory that may provide additional information in the case of intermittent faults. The ability to supervise external analog speaker(s) 300 and receive a notification of any problem is extremely useful and sometimes critical when the speakers are used to provide emergency and safety notifications.

It should be understood that supervision circuit 606 is merely an example of a supervision circuit that can be contained in each external analog speaker 300 and that other types of supervision circuits may be used within the scope of the present invention. For example, a supervision circuit may be used in which the circuit maintains a predetermined circuit impedance, in which case CPU 404 may measure the resistance or capacitance of the supervision circuit(s) connected to CPU 404 to determine the equivalent circuit impedance or a change in the equivalent circuit impedance. One skilled in the art will appreciate that CPU 404 may use this information to determine the quantity of external analog speaker(s) 300 connected to IP speaker 200 and/or to detect a change in the operational status of one or more of external analog speaker(s) 300. Thus, it should be understood that the supervision circuit may be configured to maintain any type of circuit parameter that is capable of being detected by CPU 404.

Referring again to FIG. 4, it should be understood that any external analog speaker 300 connected to IP speaker 200 is not itself an IP speaker. However, a modification could be made to "pretend" that external analog speaker 300 is an IP speaker—e.g., by assigning two media access control (MAC) addresses to IP speaker 200 (one MAC address for IP speaker 200 and one MAC address for external analog speaker 300) or by assigning one MAC address with two SIP extensions to IP speaker 200 (one SIP extension for IP speaker 200 and one SIP extension for external analog speaker 300) or separate multicast zones for the IP speaker 200 and external analog speaker 300. If IP speaker 200 receives a SIP call for external analog speaker 300, CPU 404 can disable first amplifier 410 and thereby simulate an IP speaker on behalf of external analog speaker 300. Also, if IP speaker 200 is able to support concurrent SIP calls, it is possible for IP speaker 200 to receive one audio broadcast while external analog speaker 300 receives another audio broadcast. This capability is possible due to the use of dual amplifiers—i.e., first amplifier 410 is used for one audio broadcast and second amplifier 412 is used for the other audio broadcast.

Exemplary Implementations

The IP speaker 200 described above is capable of receiving network unicast or multicast audio, with the further capabilities of connecting one or more external analog speaker(s) 300 with supervision, adhering to PoE power limits, and providing automatic equalization of audio power between all speakers. One skilled in the art will appreciate that this speaker system may be used in a variety of different implementations, examples of which are described below in connection with FIGS. 7 and 8.

Figure 7:
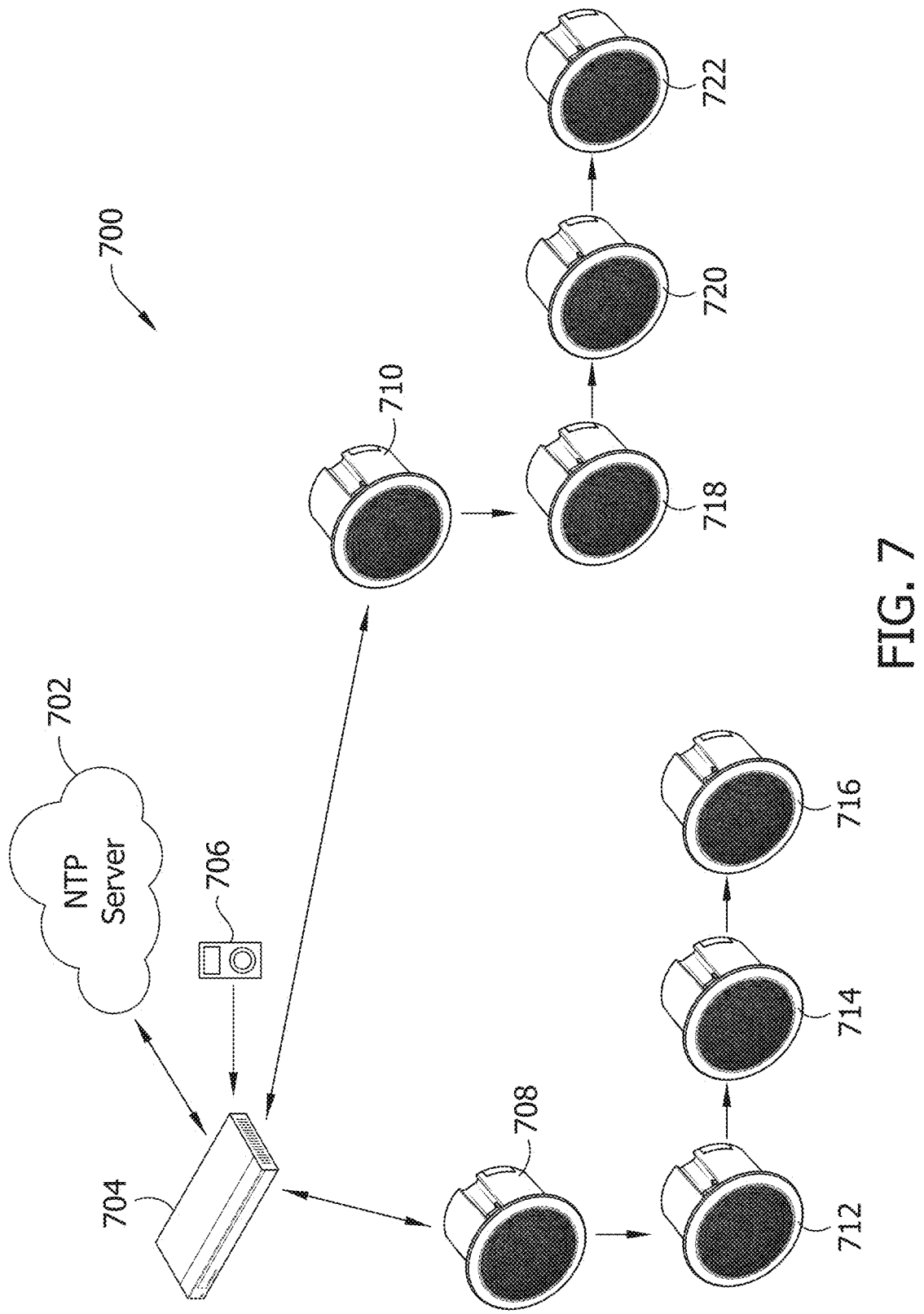
FIG. 7 is a block diagram of a system used to play scheduled announcements or background music in accordance with an implementation of the present invention.

Referring to FIG. 7, a system used to play scheduled announcements or background music in accordance with an implementation of the present invention is generally indicated by reference number 700. System 700 includes an NTP (Network Time Protocol) server 702 that communicates with a paging adapter and scheduler 704, which is configured to transmit multicast audio (e.g., voice paging, emergency alerts and scheduled tones or announcement) to IP speakers 708 and 710. Paging adapter and scheduler 704 may also receive music input from a music source 706 to multicast background music to IP speakers 708 and 710. The music stream can be configured at a lower priority to allow voice paging, emergency alerts and scheduled tones or announcements to interrupt the background music.

IP speaker 708 (which has the configuration of IP speaker 200 described above) is connected to three external analog speakers 712, 714 and 716 (each of which has the configuration of external analog speaker 300 described above). Similarly, IP speaker 710 (which has the configuration of IP speaker 200 described above) is connected to three external analog speakers 718, 720 and 722 (each of which has the configuration of external analog speaker 300 described above). While system 700 shown in FIG. 7 includes two IP speakers each of which is connected to three external analog speakers, it should be understood that the system 700 may include any number of IP speakers and external analog speakers (although each IP speaker will typically be connected to either one, two or three external analog speakers).

Figure 8:
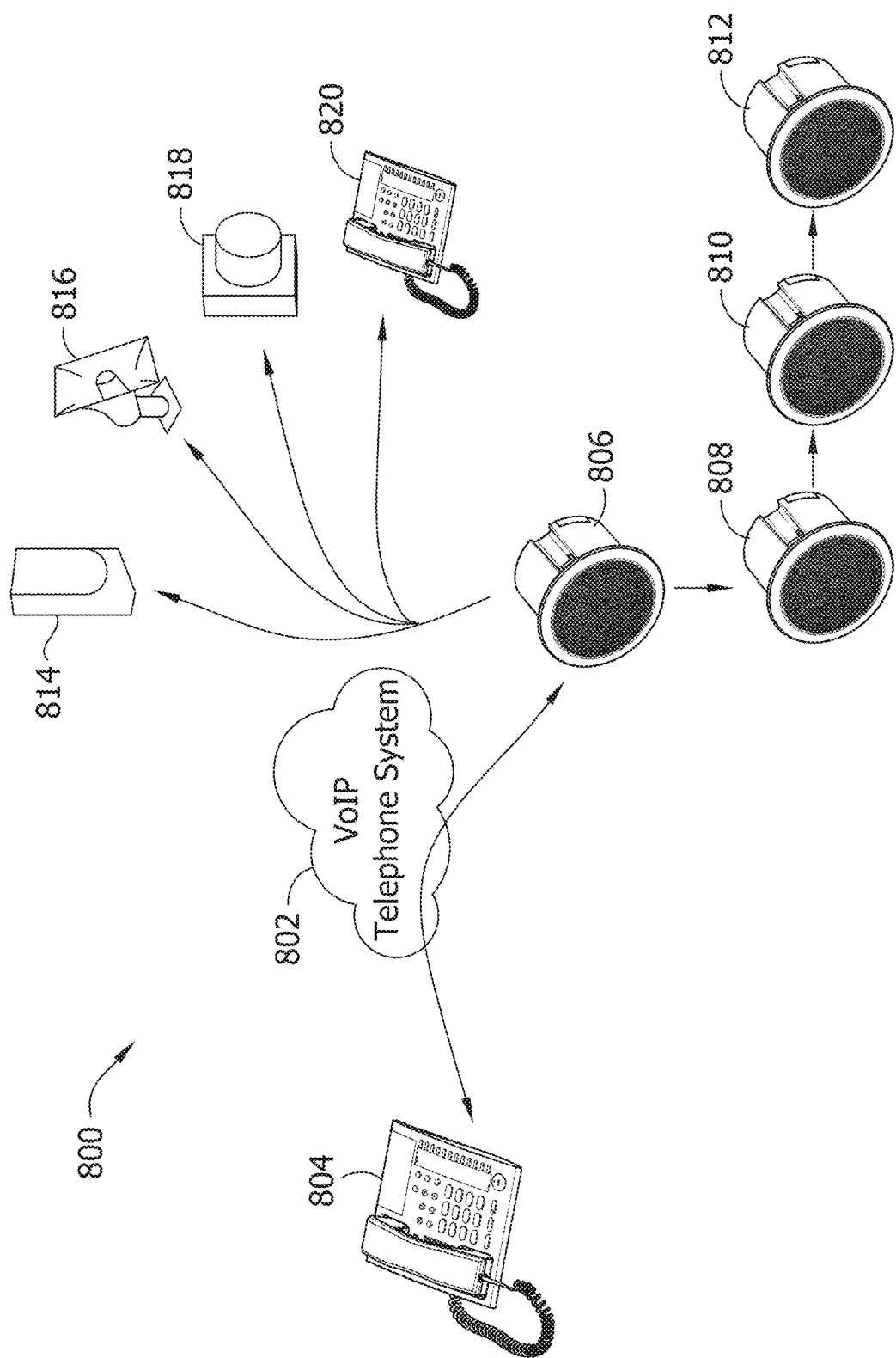
FIG. 8 is a block diagram of a system with multicast capabilities that is used to play voice pages, emergency alerts, and loud ringing in accordance with an implementation of the present invention.

Referring to FIG. 8, a system that is used to play voice pages, emergency alerts, and loud ringing in accordance with an implementation of the present invention is generally indicated by reference number 800. System 800 includes a VoIP telephone system 802 that enables an IP telephone 804 to make a SIP call to one SIP endpoint, which simultaneously launches a multicast to any number and mix of audio alerters, IP speakers, strobe lights, and multicast supported IP telephones. Only the SIP endpoint designated to send the multicast needs to be registered—i.e., the devices configured to receive the multicast do not need registration.

In this implementation, the SIP endpoint comprises IP speaker 806 (which has the configuration of IP speaker 200 described above). IP speaker 806 is connected to three external analog speakers 808, 810 and 812 (each of which has the configuration of external analog speaker 300 described above), although less or more analog speakers may be employed. Upon receipt of a SIP call, IP speaker 806 is configured to launch a multicast to an audio alerter 814, a horn speaker 816, a strobe light 818, IP telephone 820, or any combination of other IP ceiling speakers (not shown). Of course, IP speaker 806 also provides the audio to external analog speakers 808, 810 and 812 in accordance with the present invention.

General Information

The description set forth above provides several exemplary embodiments of the inventive subject matter. Although each exemplary embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The use of any and all examples or exemplary language (e.g., "such as" or "for example") provided with respect to certain embodiments is intended merely to better describe the invention and does not pose a limitation on the scope of the invention. No language in the description should be construed as indicating any non-claimed element essential to the practice of the invention.

The use of the terms "comprises," "comprising," or any other variation thereof, are intended to cover a non-exclusive inclusion, such that a system or method that comprises a list of elements does not include only those elements, but may include other elements not expressly listed or inherent to such system or method.

Finally, while the present invention has been described and illustrated hereinabove with reference to various exemplary embodiments, it should be understood that various modifications could be made to these embodiments without departing from the scope of the invention. Therefore, the present invention is not to be limited to the specific structural configurations or methodologies of the exemplary embodiments, except insofar as such limitations are included in the following claims.

What is claimed and desired to be secured by Letters Patent is as follows:

1. An Internet Protocol (IP) speaker system, comprising:
an IP speaker comprising a central processing unit (CPU) and an internal driver, wherein the CPU is configured to provide an audio data stream that is converted into a first audio signal for driving the internal driver and a second audio signal for driving one or more external drivers;
one or more external analog speakers each of which comprises one of the external drivers, wherein the CPU of the IP speaker is configured to supervise the one or more external analog speakers so as to detect any fault condition of one or more of the external analog speakers; and
wherein each of the external analog speakers comprises a supervision circuit configured to maintain a predetermined circuit parameter, and wherein the CPU is configured to determine an equivalent circuit parameter for all of the supervision circuits connected to the CPU and use the equivalent circuit parameter to detect a quantity of the external analog speakers connected to the IP speaker.

2. The IP speaker system of claim 1, wherein the CPU is configured to detect the fault condition of one or more of the external analog speakers when the equivalent circuit parameter is less than or greater than a previous equivalent circuit parameter.

3. The IP speaker system of claim 1, wherein the audio data stream is generated from a file stored in a memory of the CPU.

4. The IP speaker system of claim 1, wherein the audio data stream is transmitted over a network cable for receipt by the IP speaker.

5. The IP speaker system of claim 1, wherein electrical power is transmitted over a network cable for receipt by the IP speaker.

6. The IP speaker system of claim 5, further comprising a power circuit configured to (i) receive the electrical power as an input power, (ii) provide an output power available for consumption by the IP speaker and the one or more external analog speakers, and (iii) measure the input power and decrease the output power if the measured input power exceeds a predetermined power level.

7. The IP speaker system of claim 1, further comprising a first amplifier configured to provide the first audio signal at a first power level and a second amplifier configured to provide the second audio signal at a second power level.

8. The IP speaker system of claim 7, wherein the CPU is configured to control the first power level and the second power level so as to equalize an amount of audio power provided to each of the internal driver and the one or more external drivers.

9. The IP speaker system of claim 1, wherein a plurality of the external analog speakers are connected in series to the IP speaker.

10. An Internet Protocol (IP) speaker comprising a central processing unit (CPU), a first amplifier, a second amplifier, and an internal driver, wherein the CPU is configured to provide an audio data stream for transmission to the first amplifier and the second amplifier, wherein the first amplifier is configured to output a first audio signal at a first power level for driving the internal driver, and wherein the second amplifier is configured to output a second audio signal at a second power level for driving one or more external drivers of one or more external analog speakers.

11. The IP speaker of claim 10, wherein the CPU is configured to supervise the one or more external analog speakers so as to enable detection of any change in operational status of one or more of the external analog speakers.

12. The IP speaker of claim 11, wherein each of the external analog speakers comprises a supervision circuit configured to maintain a predetermined circuit parameter, and wherein the CPU is configured to determine an equivalent circuit parameter for all of the supervision circuits connected to the CPU and use the equivalent circuit parameter to detect a quantity of the external analog speakers connected to the IP speaker.

13. The IP speaker of claim 12, wherein the CPU is configured to detect a change in the operational status of one or more of the external analog speakers when the equivalent circuit parameter is less than or greater than a previous equivalent circuit parameter.

14. The IP speaker of claim 10, wherein the audio data stream is generated from a file stored in a memory of the CPU.

15. The IP speaker of claim 10, wherein the audio data stream is transmitted over a network cable for receipt by the IP speaker.

16. The IP speaker of claim 10, wherein electrical power is transmitted over a network cable for receipt by the IP speaker.

17. The IP speaker of claim 16, further comprising a power circuit configured to (i) receive the electrical power as an input power, (ii) provide an output power available for consumption by the IP speaker and the one or more external analog speakers, and (iii) measure the input power and decrease the output power if the measured input power exceeds a predetermined power level.

18. The IP speaker of claim 10, wherein the CPU is configured to control the first power level and the second power level so as to equalize an amount of audio power provided to each of the internal driver and the one or more external drivers.

19. The IP speaker of claim 10, wherein a plurality of the external analog speakers are connected in series to the IP speaker.

20. An Internet Protocol (IP) speaker, comprising a central processing unit (CPU), a power circuit, and an internal driver, wherein the CPU is configured to configured to provide an audio data stream that is converted into a first audio signal for driving the internal driver and a second audio signal for driving one or more external drivers of one or more external analog speakers, and wherein the power circuit is configured to (i) receive electrical power transmitted over a network cable as an input power, (ii) provide an output power available for consumption by the IP speaker and the one or more external analog speakers, and (iii) measure the input power and decrease the output power if the measured input power exceeds a predetermined power level.

21. The IP speaker of claim 20, wherein the CPU is configured to supervise the one or more external analog speakers so as to enable detection of any change in an operational status of one or more of the external analog speakers.

22. The IP speaker of claim 21, wherein each of the external analog speakers comprises a supervision circuit configured to maintain a predetermined circuit parameter, and wherein the CPU is configured to determine an equivalent circuit parameter for all of the supervision circuits connected to the CPU and use the equivalent circuit parameter to detect a quantity of the external analog speakers connected to the IP speaker.

23. The IP speaker of claim 22, wherein the CPU is configured to detect a change in the operational status of one or more of the external analog speakers when the equivalent circuit parameter is less than or greater than a previous equivalent circuit parameter.

24. The IP speaker of claim 20, wherein the audio data stream is generated from a file stored in a memory of the CPU.

25. The IP speaker of claim 20, wherein the audio data stream is transmitted over the network cable for receipt by the IP speaker.

26. The IP speaker of claim 20, further comprising a first amplifier configured to provide the first audio signal at a first power level and a second amplifier configured to provide the second audio signal at a second power level.

27. The IP speaker of claim 26, wherein the CPU is configured to control the first power level and the second power level so as to equalize an amount of audio power provided to each of the internal driver and the one or more external drivers.

28. The IP speaker of claim 20, wherein a plurality of the external analog speakers are connected in series to the IP speaker.

29. An Internet Protocol (IP) speaker, comprising:
an IP speaker comprising a central processing unit (CPU), a power circuit, a first amplifier, a second amplifier, and an internal driver, wherein the CPU is configured to provide an audio data stream for transmission to the first amplifier and the second amplifier, wherein the first amplifier is configured to output a first audio signal at a first power level for driving the internal driver, wherein the second amplifier is configured to output a second audio signal at a second power level for driving one or more external drivers of one or more external analog speakers, wherein the CPU is configured to supervise the one or more external analog speakers so as to detect any change in the operational status of one or more of the external analog speakers, and wherein the power circuit is configured to (i) receive electrical power transmitted over a network cable as an input power, (ii) provide an output power available for consumption by the IP speaker and the one or more external analog speakers, and (iii) measure the input power and decrease the output power if the measured input power exceeds a predetermined power level.

* * * * *